(12) United States Patent
Miller

(10) Patent No.: US 8,174,054 B2
(45) Date of Patent: May 8, 2012

(54) FIELD EFFECT TRANSISTOR WITH INTERDIGITATED FINGERS AND METHOD OF MANUFACTURING THEREOF

(75) Inventor: Robert Andrew Miller, Leuven (BE)

(73) Assignee: RFMD (UK) Limited, Newton Aycliffe (GB)

( * ) Notice: Subject to any disclaimer, the term of this patent is extended or adjusted under 35 U.S.C. 154(b) by 225 days.

(21) Appl. No.: 12/475,162

(22) Filed: May 29, 2009

(65) Prior Publication Data

US 2009/0309137 A1     Dec. 17, 2009

(30) Foreign Application Priority Data

May 31, 2008 (GB) .................... 0809947.5

(51) Int. Cl.
*H01L 29/772* (2006.01)
(52) U.S. Cl. ............. 257/213; 257/E21.369; 438/142
(58) Field of Classification Search ............ 257/213, 257/E21.4, E29.242; 438/142
See application file for complete search history.

(56) References Cited

U.S. PATENT DOCUMENTS

| | | | | |
|---|---|---|---|---|
| 6,465,768 B1 * | 10/2002 | Ker et al. | ........... | 250/214.1 |
| 6,787,847 B2 * | 9/2004 | Disney | ........... | 257/328 |
| 6,815,776 B2 * | 11/2004 | Lee et al. | ........... | 257/361 |
| 2002/0195662 A1 * | 12/2002 | Eden et al. | ........... | 257/349 |
| 2004/0178453 A1 * | 9/2004 | Duvvury et al. | ........... | 257/355 |
| 2005/0133839 A1 * | 6/2005 | Okushima | ........... | 257/293 |
| 2007/0020828 A1 * | 1/2007 | Hara | ........... | 438/164 |

FOREIGN PATENT DOCUMENTS

EP     480313 A * 4/1992

OTHER PUBLICATIONS

UK Search Report for GB0809947.5, mailed Sep. 18, 2008.

* cited by examiner

*Primary Examiner* — Matthew Landau
*Assistant Examiner* — Khaja Ahmad
(74) *Attorney, Agent, or Firm* — Withrow & Terranova, P.L.L.C.

(57) ABSTRACT

A field effect transistor comprising a semiconductor substrate comprising an electrically conducting channel layer therein; a plurality of source and drain fingers on a first face of the substrate, each finger separated from the adjacent finger by a gate channel; the gate channels comprising at least one active gate channel defined by a source finger and a drain finger arranged on the first face such that current is free to flow between them via the electrically conducting channel layer, and, a plurality of inactive gate channels, each inactive gate channel being defined by either two fingers of the same type or a source finger and a drain finger, the source finger and drain finger being arranged on the first face such that current is not free to flow between them via the electrically conducting channel layer; the gate channels being arranged such that each active gate channel has a gate channel on each side; each active gate channel comprising a gate therein for controlling current flow in the electrically conducting channel layer.

15 Claims, 8 Drawing Sheets

FIELD EFFECT TRANSISTOR WITH INTERDIGITATED FINGERS AND METHOD OF MANUFACTURING THEREOF

This application claims priority to UK patent application number 0809947.5, filed May 31, 2008, the disclosure of which is incorporated herein by reference in its entirety.

FIELD OF THE DISCLOSURE

The present invention relates to a field effect transistor (FET) and a method of manufacture thereof. More particularly, but not exclusively, the present invention relates to a field effect transistor having source and drain fingers defining active and inactive gate channels, each active gate channel having a gate therein and at least one gate channel on each side. More particularly, but not exclusively, the present invention relates to a method of manufacture of such a field effect transistor.

BACKGROUND

Field effect transistors comprising a plurality of interdigitated source and drain fingers above an electrically conducting channel are known. The fingers are spaced apart to define gate channels. A gate is arranged in each gate channel. The operation of such field effect transistors is known and will not be described in detail.

A problem with such a known field effect transistor is lack of uniformity in gate dimensions across the FET. Due to the manufacturing process gates towards the edge of the FET tend to be slightly wider than the gates towards the centre. This results in inferior performance of the FET. A wider gate results in lower operating speed. In the case of a FET comprising gates of different widths the speed is limited by the slowest part. Optimum speed is achieved when all the gates have the same small dimensions. The present invention seeks to overcome this problem.

SUMMARY OF THE DETAILED DESCRIPTION

Accordingly, in a first aspect, the present invention provides a field effect transistor comprising:
  a semiconductor substrate comprising an electrically conducting channel layer therein;
  a plurality of source and drain fingers on a first face of the substrate, each finger separated from the adjacent finger by a gate channel;
  the gate channels comprising at least one active gate channel defined by a source finger and a drain finger arranged on the first face such that current is free to flow between them via the electrically conducting channel layer, and, a plurality of inactive gate channels, each inactive gate channel being defined by either two fingers of the same type or a source finger and a drain finger, the source finger and drain finger being arranged on the first face such that current is not free to flow between them via the electrically conducting channel layer;
  the gate channels being arranged such that each active gate channel has a gate channel on each side;
  each active gate channel comprising a gate therein for controlling current flow in the electrically conducting channel layer.

The FET according to the invention has a higher degree of uniformity of gate dimensions than known FETs.

Preferably, at least one finger defining a side of an active gate channel is a common finger which also defines a side of an adjacent gate channel.

Preferably, each of the fingers defining at least one active gate channel is a common finger.

Preferably, each finger defining each active gate channel is a common finger.

At least some of the source and drain fingers can be interdigitated.

Preferably, the interdigitated fingers are arranged as alternating source and drain fingers with there being one source finger between consecutive drain fingers and vice versa.

At least two consecutive source fingers can have a plurality of drain fingers sandwiched therebetween.

At least two consecutive drain fingers can have a plurality of source fingers sandwiched therebetween.

Preferably, all of the source and drain fingers are interdigitated.

Alternatively, the plurality of source and drain fingers comprise first and second end fingers and a plurality of interdigitated source and drain fingers sandwiched therebetween, each end finger being of the same type as the adjacent finger of the interdigitated source and drain fingers to define an inactive gate channel therebetween.

At least one inactive gate channel can comprise a gate.

At least one of the inactive gate channels can be defined by two fingers of the same type.

At least one of the inactive gate channels can be defined by a source finger and a drain finger.

At least one of the source finger and drain finger of the inactive gate channel can be arranged on an insulating portion of the semiconductor substrate.

In a further aspect of the invention there is provided a method of manufacture of a field effect transistor comprising the steps of:
  providing a semiconductor substrate having an electrically conducting channel layer therein;
  a plurality of source and drain fingers on a first face of the substrate, each finger separated from the adjacent finger by a gate channel;
  the gate channels comprising at least one active gate channel defined by a source finger and a drain finger arranged on the first face such that current is free to flow between them via the electrically conducting channel layer, and, a plurality of inactive gate channels, each inactive gate channel being defined by either two fingers of the same type or a source finger and a drain finger, the source finger and drain finger being arranged on the first face such that current is not free to flow between them via the electrically conducting channel layer;
  the gate channels being arranged such that each active gate channel has a gate channel on each side; and,
  providing a gate in each active gate channel.

Preferably, the step of providing a gate in each active gate channel comprises
the steps of covering at least a portion of the substrate and the fingers with a resist;
removing portions of the resist to expose the active gate channels; and,
depositing a gate in each of the active gate channels.

Preferably, the step of removing portions of the resist comprises removing portions of the resist to expose each active gate channel and at least one inactive gate channel; and, the step of depositing the gates comprises depositing a gate in each active gate channel and the at least one exposed inactive gate channel.

BRIEF DESCRIPTION OF THE DRAWINGS

The present invention will now be described by way of example only and not in any limitative sense with reference to the accompanying drawings in which.

DETAILED DESCRIPTION

Figure 1:
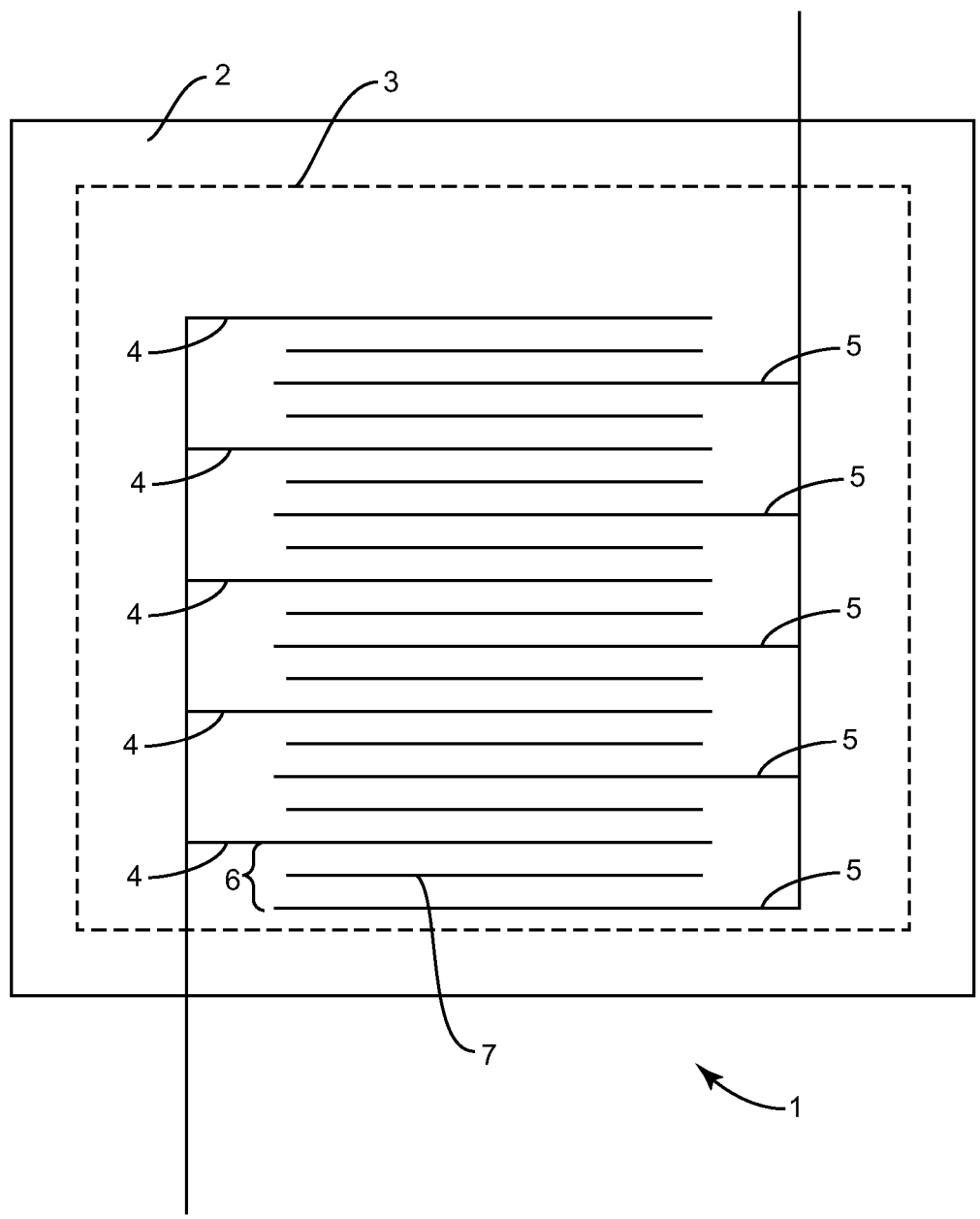
FIG. 1 shows a known FET in plan view.

FIG. 1 shows a known FET 1 in plan view. The FET 1 comprises a semiconductor substrate 2 having an electrically conducting channel layer 3 therein. Arranged on a first face of the substrate 2 above the electrically conducting channel layer 3 are a plurality of interdigitated source and drain fingers 4,5. The fingers 4,5 are spaced apart to define gate channels 6. Arranged in each of the gate channels 6 is a gate 7. In use current is free to flow between the source and drain fingers 4,5 defining the gate channels 6 via the electrically conducting channel layer 3. Such gate channels 6 are therefore termed 'active' gate channels 6b. The gates 7 within the active gate channels 6b control the current flow. Each of the fingers 4,5 except the two outermost fingers 4,5 are 'common' fingers and define a side of the gate channel 6 on each side of the common finger 4,5.

FIGS. 2(a) to 2(f) show a known method of manufacture of the FET 1 of FIG. 1. In a first step a semiconductor substrate 2 is provided. The substrate 2 includes an electrically conducting channel layer 3. Arranged on the substrate 2 are interdigitated source and drain fingers 4,5 spaced apart to define gate channels 6 (FIG. 2 (a)). Methods of manufacture of such structures are known and will not be described in detail.

Figure 2A:
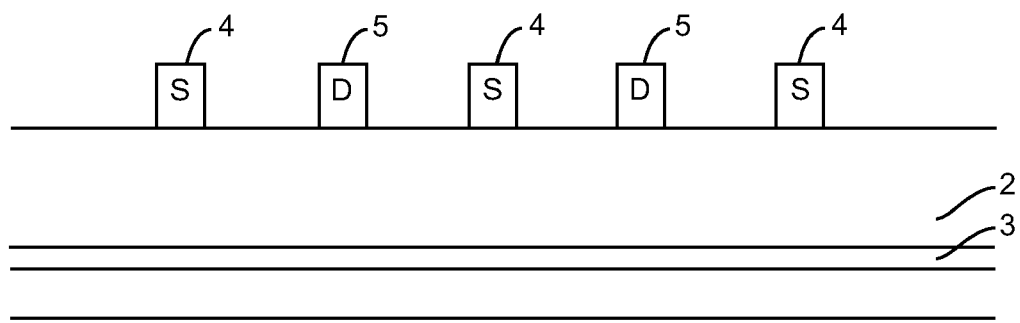
FIGS. 2(a) to 2(f) shows a known method of manufacture of the field effect transistor of FIG. 1.
Figure 2B:
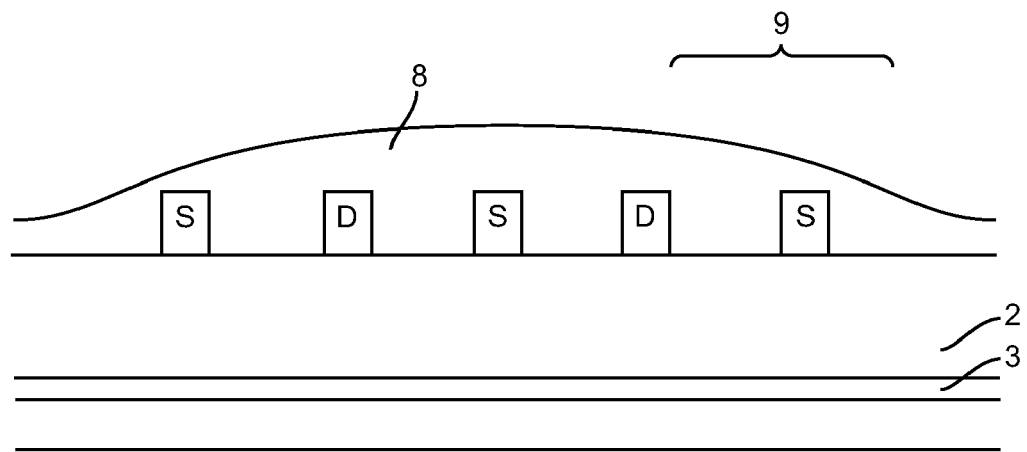
Figure 2C:
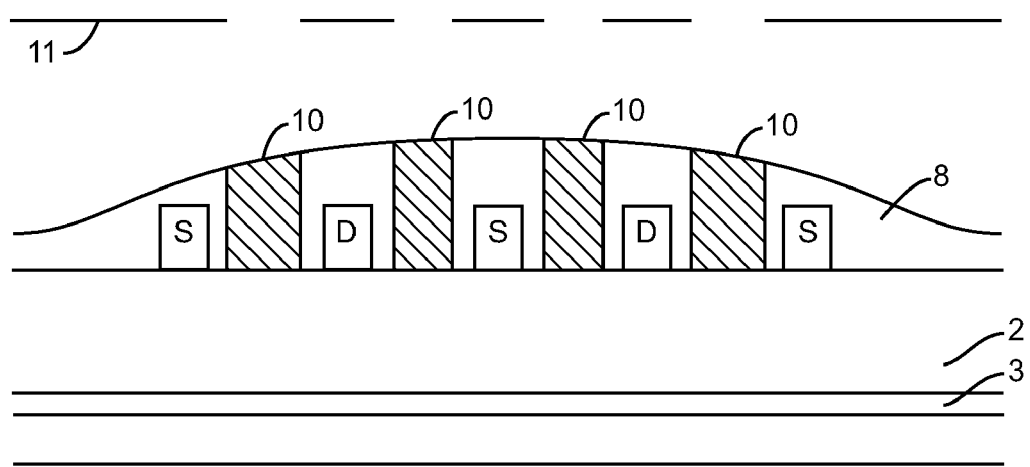
Figure 2D:
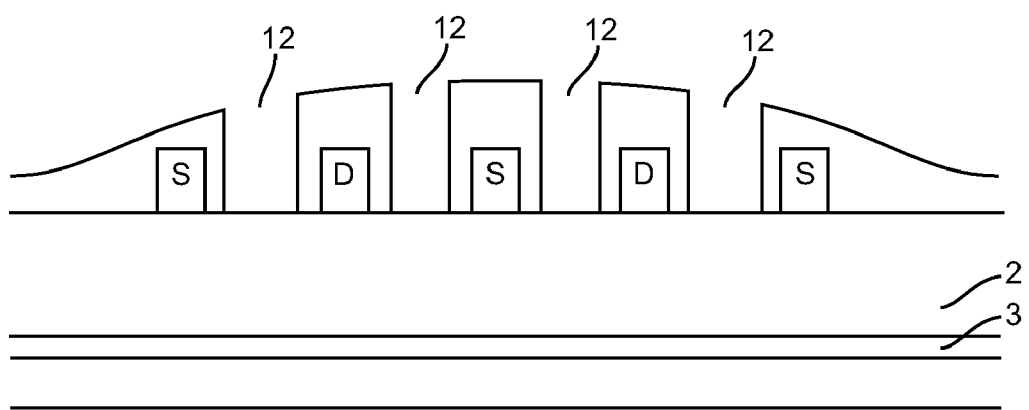

In a next step the substrate 2 and source and drain fingers 4,5 are coated with a photoresist 8 (FIG. 2(b)). The photoresist 8 does not form a smooth layer on the upper face of the substrate 2. The photoresist 8 is thicker over the fingers 4,5 than remote from the fingers 4,5 with a transition region 9 of varying thickness therebetween.

Portions 10 of the photoresist 8 are then illuminated through a mask 11 and the illuminated portions 10 removed by etching to produce apertures 12 which expose the gate channels 6 (FIGS. 2 (c) and (d)). Because the photoresist 8 thins in a direction going away from the fingers 4,5 as shown, the apertures 12 in the photoresist 8 near the edge of the FET 1 are wider than those close to the centre where the photoresist 8 is of uniform thickness.

Figure 2E:
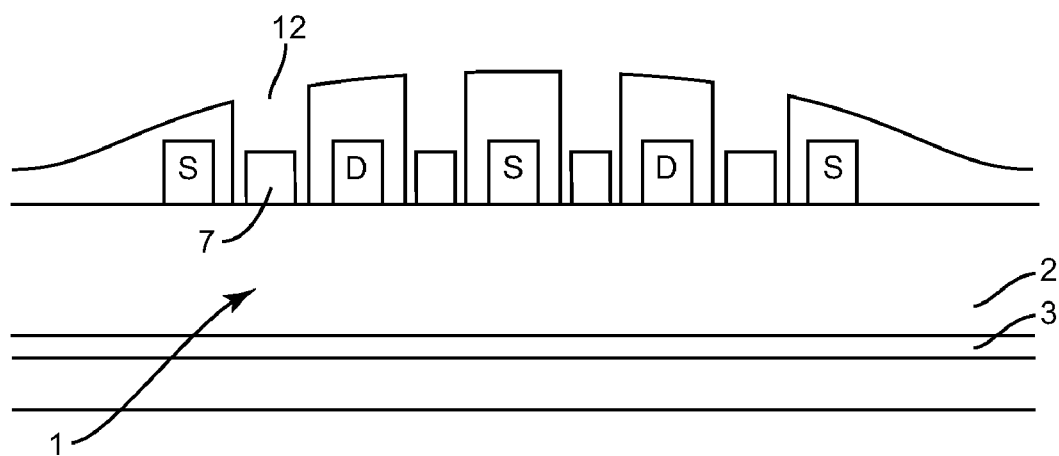
Figure 2F:
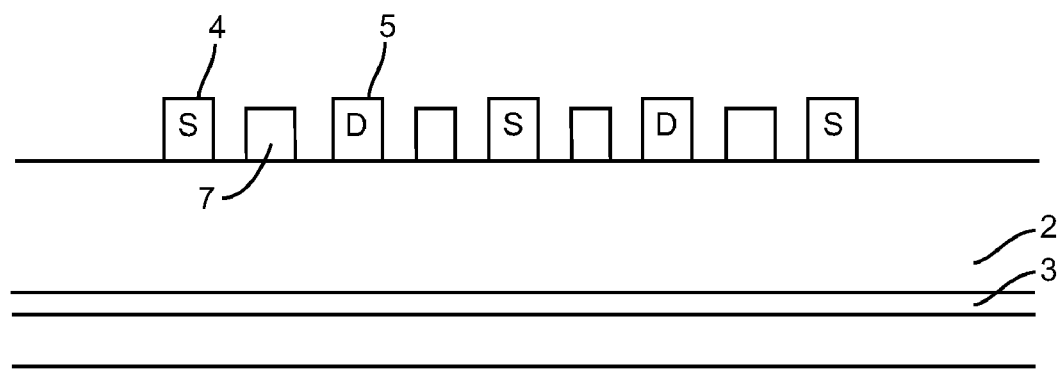

Gates 7 are then deposited in the apertures 12 in the photoresist 8 (FIG. 2(e)) and the photoresist 8 removed to produce a field effect transistor 1 having gates 7 which increase in width towards the edge of the FET 1 (FIG. 2(f)). Increasing gate width towards the edge of the FET 1 is undesirable because speed of operation is influenced by the gate width. The edge parts of the FET 1 with large gate widths operate more slowly than the central parts with smaller gate widths. The composite FET 1 operates at some intermediate speed. It is desirable that it operates at the speed of the fastest part, requiring all the gate widths to be uniformly small.

This thinning of the photoresist 8 towards the edge of the transistor 1 is not the only cause of variation in gate width. The size of the aperture 12 formed in the photoresist 8 is influenced by the total amount of illumination received during the illumination step. Gate channels 6 towards the edge of the transistor 1 will receive less light reflected from the side walls of fingers 4,5 defining adjacent gate channels 6. Accordingly, the apertures 12 in the photoresist 8 close to the edge of the FET 1 will have a different width to those nearer to the centre, even if the thickness of the photoresist 8 remains constant.

Figure 3A:
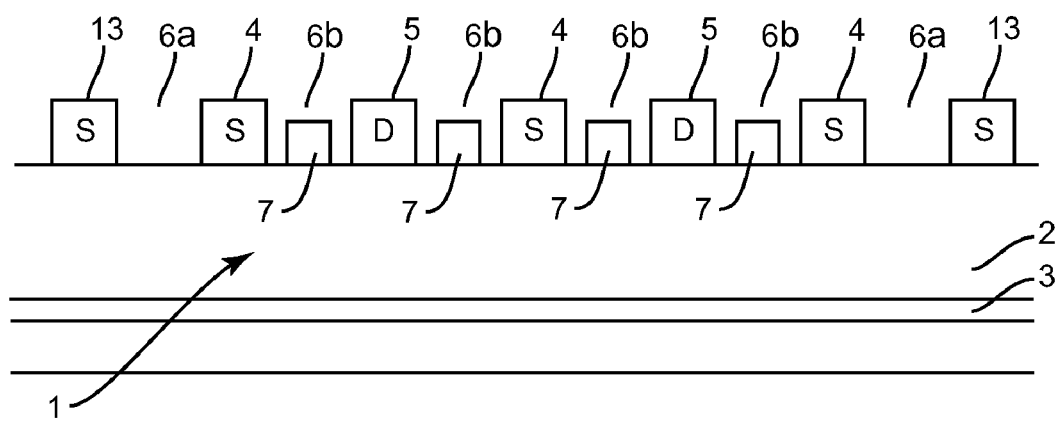
FIG. 3A shows a field effect transistor according to the disclosure in cross section.
Figure 3B:
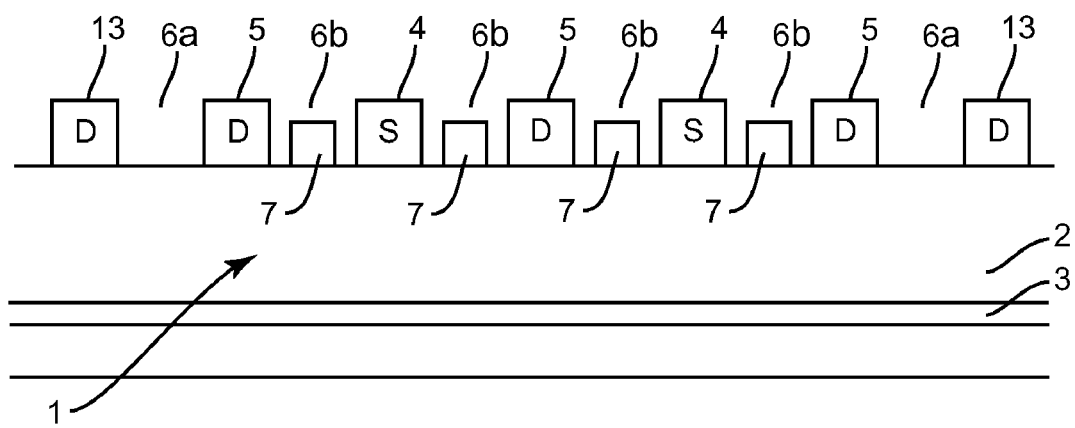
FIG. 3B shows an alternate embodiment of a field effect transistor according to the disclosure in cross section.

Shown in FIG. 3A is a field effect transistor 1 according to the invention in cross section. The field effect transistor 1 comprises a substrate 2 having an electrically conducting channel layer 3 therein. Arranged on a first face of the substrate 2 are a plurality of spaced apart interdigitated source and drain fingers 4,5. The interdigitated fingers 4,5 are arranged such that there is one source finger 4 arranged between consecutive drain fingers 5 and vice versa. The interdigitated source and drain fingers 4,5 are sandwiched between first and second end fingers 13. Each end finger 13 is of the same type as the adjacent interdigitated finger 4,5. In this embodiment each end finger and adjacent finger 13 is a source finger 4. In an alternative embodiment (illustrated in FIG. 3B) they are drain fingers 5.

In use each end finger 13 is always at the same potential as its adjacent finger 4,5. There is therefore negligible current flow in the gate channel 6 between them. The gate channel 6 defined by an end finger 13 and its adjacent finger 4,5 is therefore an 'inactive' gate channel 6a. The remaining gate channels 6 defined by the interdigitated source and drain fingers 4,5 are active gate channels 6b. Each active gate channel 6b therefore has at least one gate channel 6 (either active or inactive) on either side. Each active gate channel 6b includes a gate 7 for controlling current flow in the electrically conducting layer 3.

The field effect transistor 1 of FIG. 3A is manufactured by a process similar to that of FIG. 2(a) to (f). The fingers 4,5 are coated with a photoresist 8. Portions 10 of the photoresist 8 are then exposed. The exposed portions 10 are then removed to expose the gate channels 6 into which gates 7 are to be deposited. The gates 7 are then deposited in the desired gate channels 6 and the remaining photoresist 8 removed.

Because each active gate channel 6b has at least one gate channel 6 on each side, the photoresist 8 covering the active gate channels 6b is relatively smooth and of a uniform thickness. Also, these active gate channels 6b all receive the same amount of illumination due to the gate channels 6 on either side. The apertures 12 in the photoresist 8 above the active gate channels 6b are therefore of uniform width across the FET 1 resulting in gates 7 of uniform width in the active gate channels 6b.

Figure 4A:
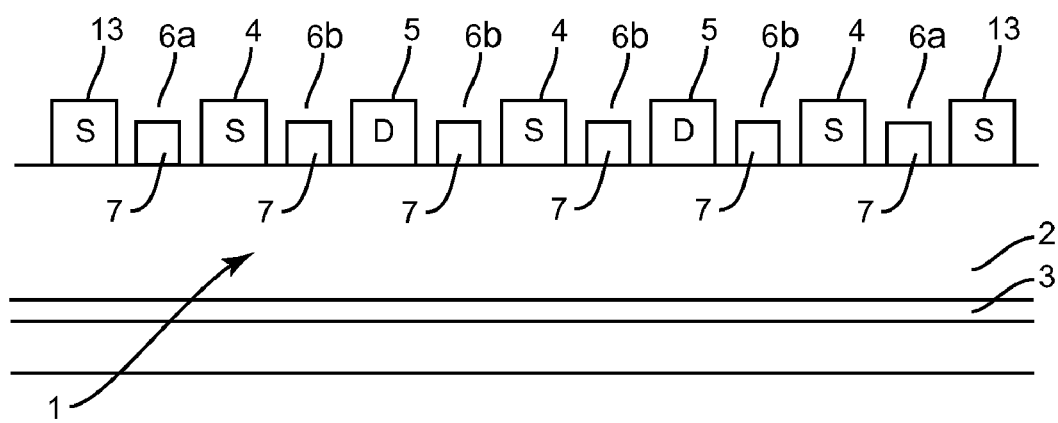
FIG. 4A shows a further embodiment of a field effect transistor according to the disclosure invention.
Figure 4B:
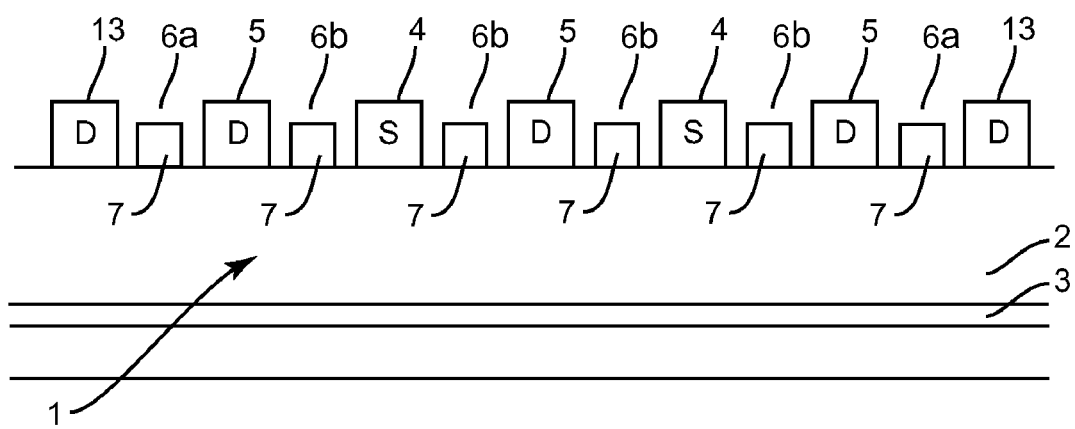
FIG. 4B shows an alternate embodiment of a field effect transistor according to the disclosure.

Shown in FIG. 4A is a further embodiment of a FET 1 according to the invention. The embodiment is similar to that of FIG. 3 except that it includes gates 7 in the non active gate channels 6a. The non active gate channels 6a do not have gate channels 6 on both sides. Accordingly, the gates 7 in the non active gate channels 6a may have different dimensions than the gates 7 in the active gate channels 6b. However, as no current flows beneath a gate 7 in a non active gate channel 6a this has little detrimental effect on the performance of the transistor 1. Similarly, FIG. 4B is identical to the embodiment of FIG. 4A except the end fingers 13 are drains instead of sources.

Figure 5:
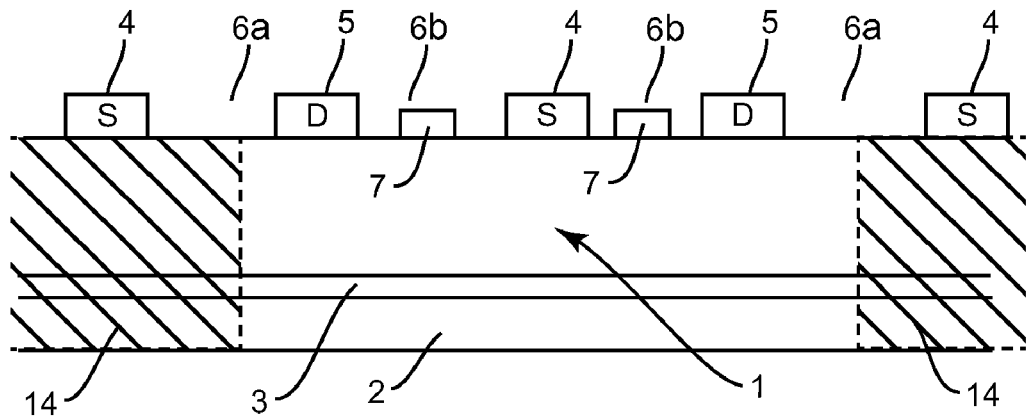
FIG. 5 shows a further embodiment of a field effect transistor according to the disclosure.

Shown in FIG. 5 is a further embodiment of a field effect transistor 1 according to the invention. The field effect transistor 1 comprises spaced apart interdigitated source and drain fingers 4,5 arranged on the first face of a substrate 2, the substrate 2 comprising an electrically conducting channel layer 3. The outermost fingers 4 sit on insulating portions 14 of the substrate 2. Current is therefore not free to flow between each of these fingers 4 and their adjacent fingers 5. These outermost fingers 4 and their adjacent fingers 5 therefore define non active gate channels 6a. The gate channels 6 defined by the remaining fingers 4,5 are active gate channels 6b. Each active gate channel 6b contains a gate 7 for controlling current flow.

In the embodiment of FIG. 5 each finger 4,5 on an insulating portion 14 is of the opposite type to its adjacent finger 4,5. In alternative embodiments one or more of the fingers 4,5 on the insulating portion 14 is of the same type as its adjacent interdigitated finger 4,5.

All of the above embodiments comprise a plurality of active gate channels 6b sandwiched between two inactive gate channels 6a. This can be achieved by sandwiching interdigitated source and drain fingers 4,5 between end fingers 13, each end finger 13 being the same type as its adjacent finger 4,5. Alternatively, this can be achieved by positioning the outermost fingers 4,5 on insulating portions 14 of the substrate 2. A combination of these two options is also possible with one inactive gate channel 6a defined by an end finger 13 and an adjacent finger of the same type 4,5 and the other inactive gate channel 6a defined by two fingers 4,5 (of either the same type or different types) one of which is on an insulating portion 14 of the substrate 2.

Figure 6A:
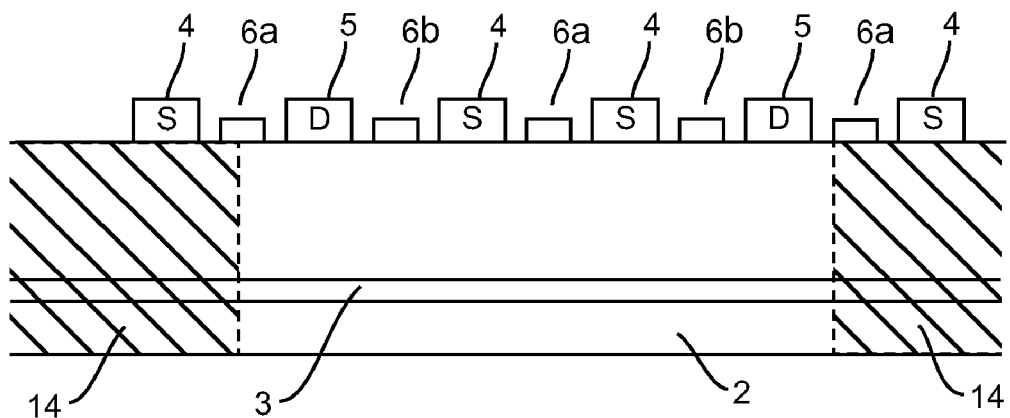
FIG. 6A shows a further embodiment of a field effect transistor according to the disclosure.
Figure 6B:
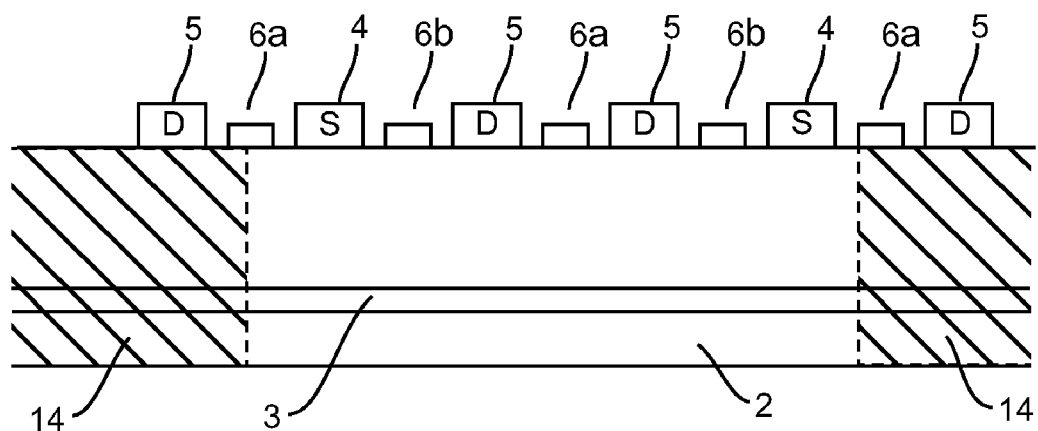
FIG. 6B illustrates an alternate embodiment of the field effect transistor according to the disclosure.

FIG. 6A shows a further embodiment of the FET 1 according to the invention in cross section. This embodiment includes an inactive gate channel 6a between active gate channels 6b. This is achieved by changing the interdigitation of the source and drain fingers 4,5 such that there are a plurality of source fingers 4 between consecutive drain fingers 5. The adjacent source fingers 4 define a non-active gate channel 6a. The FET 1 of this embodiment also includes gates 7 within the non-active gate channels 6a. In an alternative embodiment (illustrated in FIG. 6B) the interdigitated fingers 4,5 are arranged such that there are a plurality of drain fingers 5 between consecutive source fingers 4.

The above embodiments of the FET 1 according to the invention have been described without detailed description of the layers below the top face of the substrate 2. The invention is equally applicable to all types of field effect transistor 1 where the current flows between source 4 and drain 5 and is controlled by gates 7 in active gate channels 6b. The semiconductor layer can be a single semiconductor layer 2 or may have a multi layer semiconductor structure. Similarly, the electrically conducting channel layer 3 may be a simple delta doped layer or may be a more complex arrangement including multiple conducting layers. The conducting layer(s) can be bulk doped layers or delta doped. Typical semiconductors layers can comprise silicon or III-V semiconductor layers such as GaAs, AlGaAs or InGaAs as is known to one skilled on the art. The fingers 4,5 may be arranged on ohmic contact layers (not shown).

The invention claimed is:
1. A field effect transistor comprising:
   a semiconductor substrate comprising an electrically conducting channel layer therein;
   a first edge finger positioned on a first face of the substrate and the first edge finger comprising either a source finger or a drain finger;
   a second edge finger wherein the second edge finger is either a source finger or a drain finger and being a same type of finger as the first edge finger;
   a plurality of interior fingers positioned between the first edge finger and the second edge finger and comprising a first plurality of source fingers and a second plurality of drain fingers, each finger separated from an adjacent finger by a gate channel;
   the gate channel comprising at least one active gate channel defined by a source finger and a drain finger arranged on the first face such that current is free to flow between them via the electrically conducting channel layer, and a plurality of inactive gate channels, at least a first of the plurality of inactive gate channels being defined in part by the first edge finger and an interior finger and at least a second of the plurality of inactive gate channels being defined in part by the second edge finger and a different interior finger;
   the gate channels being arranged such that each active gate channel has a gate channel on each side and each edge finger has a gate channel on only one side; and
   each active gate channel comprising a gate therein for controlling current flow in the electrically conducting channel layer.

2. A field effect transistor as claimed in claim 1, wherein at least one finger defining a side of an active gate channel is a common finger which also defines a side of an adjacent gate channel.

3. A field effect transistor as claimed in claim 2, wherein each of the fingers defining at least one active gate channel is a common finger.

4. A field effect transistor as claimed in claim 2, wherein each finger defining each active gate channel is a common finger.

5. A field effect transistor as claimed in claim 1, wherein at least some of the source and drain fingers are interdigitated.

6. A field effect transistor as claimed in claim 5, wherein the interdigitated fingers are arranged as alternating source and drain fingers with there being one source finger between consecutive drain fingers and vice versa.

7. A field effect transistor as claimed in claim 5, wherein at least two consecutive source fingers have a plurality of drain fingers sandwiched therebetween.

8. A field effect transistor as claimed in claim 1, wherein at least two consecutive drain fingers have a plurality of source fingers sandwiched therebetween.

9. A field effect transistor as claimed in claim 1, wherein all of the source and drain fingers are interdigitated.

10. A field effect transistor as claimed in claim 1, wherein the plurality of source and drain fingers comprise first and second end fingers and a plurality of interdigitated source and drain fingers sandwiched therebetween, each end finger being of the same type as the adjacent finger of the interdigitated source and drain fingers to define an inactive gate channel therebetween.

11. A field effect transistor as claimed in claim 1, wherein at least one of the inactive gate channels is defined by two fingers of the same type.

12. A field effect transistor as claimed in claim 1, wherein at least one of the inactive gate channels is defined by a source finger and a drain finger.

13. A field effect transistor as claimed in claim 12, wherein at least one of the source finger and drain finger of the inactive gate channel is arranged on an insulating portion of the semiconductor substrate.

14. A field effect transistor comprising:
- a semiconductor substrate comprising an electrically conducting channel layer therein and a first insulating portion and a second insulating portion;
- a first edge finger positioned on the first insulating portion on a first face of the substrate and the first edge finger comprising a source finger;
- a second edge finger positioned on the second insulating portion of the first face of substrate and the second edge finger comprising a source finger;
- a plurality of interior fingers positioned between the first edge finger and the second edge finger and comprising a plurality of drain fingers and at least one source finger, each finger separated from an adjacent finger by a gate channel;
- the gate channel comprising at least one active gate channel defined by a source finger and a drain finger arranged on the first face such that current is free to flow between them via the electrically conducting channel layer, and a plurality of inactive gate channels, at least a first of the plurality of inactive gate channels being defined in part by the first edge finger and an interior finger and at least a second of the plurality of inactive gate channels being defined in part by the second edge finger and a different interior finger;
- the gate channels being arranged such that each active gate channel has a gate channel on each side and each edge finger has a gate channel on only one side; and
- each active gate channel comprising a gate therein for controlling current flow in the electrically conducting channel layer.

15. A method comprising:
- providing a semiconductor substrate comprising an electrically conducting channel layer therein;
- providing a first edge finger positioned on a first face of the substrate and the first edge finger comprising either a source finger or a drain finger;
- providing a second edge finger wherein the second edge finger is either a source finger or a drain finger and being a same type of finger as the first edge finger;
- providing a plurality of interior fingers positioned between the first edge finger and the second edge finger and comprising a first plurality of source fingers and a second plurality of drain fingers, each finger separated from an adjacent finger by a gate channel;
- the gate channel comprising at least one active gate channel defined by a source finger and a drain finger arranged on the first face such that current is free to flow between them via the electrically conducting channel layer, and a plurality of inactive gate channels, at least a first of the plurality of inactive gate channels being defined in part by the first edge finger and an interior finger and at least a second of the plurality of inactive gate channels being defined in part by the second edge finger and a different interior finger;
- the gate channels being arranged such that each active gate channel has a gate channel on each side; and
- each active gate channel comprising a gate therein for controlling current flow in the electrically conducting channel layer.

* * * * *